US010965282B2

(12) United States Patent
Jardel et al.

(10) Patent No.: US 10,965,282 B2
(45) Date of Patent: Mar. 30, 2021

(54) INSULATED POWER SWITCHING CELL

(71) Applicants: THALES, Courbevoie (FR); COMMISSARIAT A L'ENERGIE ATOMIQUE ET AUX ENERGIES ALTERNATIVES, Paris (FR); UNIVERSITE DE LIMOGES, Limoges (FR)

(72) Inventors: Olivier Jardel, Palaiseau (FR); Raymond Quere, Saint Pantaleon de Larche (FR); Stéphane Piotrowicz, Magny les Hameaux (FR); Philippe Bouysse, Vicq-sur-Breuilh (FR); Sylvain Delage, Orsay (FR); Audrey Martin, Rilhac-Rancon (FR)

(73) Assignees: THALES, Courbevoie (FR); COMMISSARIAT A L'ENERGIE ATOMIQUE ET AUX ENERGIES ALTERNATIVES, Paris (FR); UNIVERSITE DE LIMOGES, Limoges (FR)

( * ) Notice: Subject to any disclaimer, the term of this patent is extended or adjusted under 35 U.S.C. 154(b) by 0 days.

(21) Appl. No.: 16/490,017

(22) PCT Filed: Feb. 27, 2018

(86) PCT No.: PCT/EP2018/054826
§ 371 (c)(1),
(2) Date: Aug. 29, 2019

(87) PCT Pub. No.: WO2018/158259
PCT Pub. Date: Sep. 7, 2018

(65) Prior Publication Data
US 2019/0386656 A1 Dec. 19, 2019

(30) Foreign Application Priority Data
Mar. 2, 2017 (FR) ...................... 1700205

(51) Int. Cl.
H03K 17/687 (2006.01)
H02M 3/156 (2006.01)
(Continued)

(52) U.S. Cl.
CPC .......... *H03K 17/687* (2013.01); *H02M 3/156* (2013.01); *H03F 3/19* (2013.01); *H03K 19/09407* (2013.01)

(58) Field of Classification Search
CPC ............ H04L 25/026; H03K 19/00346; H03K 19/00353; H03K 19/00361; H03K 19/003;
(Continued)

(56) References Cited

U.S. PATENT DOCUMENTS 5,360,979 A * 11/1994 Joseph ............. H03K 17/04123
250/551
5,514,996 A 5/1996 Aizawa
(Continued)

FOREIGN PATENT DOCUMENTS

FR       3 020 222 A1    10/2015
WO       96/18240 A1     6/1996
WO    2015/162063 A1    10/2015

OTHER PUBLICATIONS

Stokes, et al., "Reverse Current Protection in Load Switches", ECN, May 30, 2005.

*Primary Examiner* — Bryan R Perez
(74) *Attorney, Agent, or Firm* — BakerHostetler

(57) ABSTRACT

A power switching cell, and associated multi-level converter, include an input port capable of receiving a switching control signal, an input transistor linked by the gate to the input port, and by the source to a reference voltage, a self-biasing circuit comprising a self-biasing transistor linked by the gate to the drain of the input transistor, and a (Continued)

resistor connected in parallel between the gate and the source of the self-biasing transistor, and in series between the drain of the input transistor and the source of the self-biasing transistor, a power transistor, linked by the gate to the source of the self-biasing transistor and by the drain to a power supply voltage, and an isolating transistor linked by the gate and by the source to the gate and to the source of the power transistor, and by the drain to the output port of the cell.

10 Claims, 12 Drawing Sheets

(51) Int. Cl.
*H03F 3/19* (2006.01)
*H03K 19/094* (2006.01)

(58) Field of Classification Search
CPC ....... H03K 19/00307; H03K 19/00315; H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691; H03K 17/731; H03K 17/10; H03K 17/102; H03K 17/107; H03K 17/12; H03K 17/122; H03K 17/127; G11B 5/02; G11B 5/022
See application file for complete search history.

(56) References Cited

U.S. PATENT DOCUMENTS

| | | | |
|---|---|---|---|
| 2007/0090414 A1* | 4/2007 | Sutou | H01L 27/0266 257/277 |
| 2017/0047924 A1* | 2/2017 | Jardel | H03K 19/09407 |

* cited by examiner

INSULATED POWER SWITCHING CELL

CROSS-REFERENCE TO RELATED APPLICATIONS

This application is a National Stage of International patent application PCT/EP2018/054826, filed on Feb. 27, 2018, which claims priority to foreign French patent application No. FR 1700205, filed on Mar. 2, 2017, the disclosures of which are incorporated by reference in their entirety.

FIELD OF THE INVENTION

The invention lies in the technical field of high-frequency switched-mode power supplies, and more specifically of power supplies of this type when they are produced in the form of monolithic microwave integrated circuits (MMIC). The invention applies more particularly to the production of switched-mode power supplies for bias modulators in the case of applications for dynamic management of the biasing of radiofrequency (RF) amplifiers.

BACKGROUND

The dynamic management of the biasing of the RF amplifiers in a transmission chain, so as to follow the variations of the envelope of the signal to be amplified, is a major issue in modern communication systems, because it makes it possible to operate the amplifiers at the point of operation that maximizes electrical efficiencies.

FIGS. 1a to 1d illustrate the issues of this management.

FIG. 1a is a simplified representation of a transmission chain in a standard piece of equipment. A baseband-modulated signal, whose amplitude varies over time, is transposed to a carrier frequency by a radio chain 110, then amplified by a power amplifier 111.

The amplifier 111 is powered/biased by a DC voltage generator 112, the transmitted signal is the signal 113.

FIG. 1b simplistically illustrates the level of the transmitted signal 113, and the energy dissipated by the amplifier. Since the bias voltage 112 of the amplifier is direct, the energy 114 consumed by the amplifier is constant, and is so independently of the power variations of the signal 113. The level of the bias voltage of the amplifier is then dimensioned relative to the maximum power level of the signal to be transmitted. When the level of the transmitted signal does not reach its maximum value, the power difference 115 is then lost and dissipated as heat, which is synonymous with an unnecessary expenditure of energy and heating of the component.

FIG. 1c is a simplified representation of a transmission chain in a piece of equipment configured to conduct the tracking of the envelope of a signal to be transmitted.

Just as in the case presented in FIG. 1a, the signal is baseband-modulated then transposed to carrier frequency by a radio chain 120, and finally amplified by a power amplifier 121.

The difference with respect to FIG. 1a is that the bias voltage generator 122 for the power amplifier follows the power variations of the signal 123 transmitted.

FIG. 1d illustrates the effects of controlling the bias voltage of the amplifier, in the case of the transmission of a signal with non-constant amplitude. This voltage 124 varies so as to follow the variations of the signal to be transmitted 123. Thus, the power dissipated as heat 125 is reduced to the minimum, which makes it possible to save energy in the transmission device.

These savings are all the greater when the transmitted power level is great, which is why the dynamic management of the biasing of the amplifiers is a solution of interest in power microwave electronics.

Techniques for the dynamic management of the bias voltage of amplifiers have been known for several years, but their implementation has occurred only recently, primarily for two reasons:

the development of transistors in GaN (gallium nitride) technology finally makes it possible to technically consider these solutions, the increasingly widespread development of wireless telecommunication systems, for which the architectures of conventional amplifiers have low electrical efficiencies, have been the subject of significant research efforts with a view to economies that can be realized in terms of electrical consumption.

The dynamic bias management systems are composed, among other things, of voltage modulators, which are themselves composed of one or more switched-mode power supplies, the bandwidth of which needs to be at least equal to that of the envelope of the RF signals to be amplified.

One key element of these switched-mode power supplies lies in the power switching cell, which makes it possible to switch, at its output, a power signal as a function of a low-power control signal applied to its input. This cell must more particularly satisfy two criteria: speed of switching and low electrical consumption.

To produce a switched-mode power supply from these switching cells, two major families of techniques are known:

The so-called pulse width modulation (PWM) techniques, which consist in modulating a power supply voltage by a logic signal whose frequency varies as a function of the output voltage value sought. To operate optimally, the logic signal must have a frequency at least 5 or 10 times greater than the sampling frequency of the signal to be transmitted. A single cell is then required. The resulting signal from this cell is a series of pulses for which the voltage is equal to the initial voltage, these pulses being more or less wide depending on the output voltage sought. The signal is then filtered by a low-pass filter, so as to obtain a signal whose level is a function of the width of the pulses. Many variants of these pulse width modulation techniques exist, such as, for example, the use of a triangular logic signal, or control by hysteresis.

The so-called multi-level switch techniques, which consist in connecting in parallel several cells delivering a voltage of different levels, each of the cells having a distinct output level. The frequency of the switchings is then less great than in the preceding case.

The multi-level converters have the advantage of considerably reducing the needs of the cells in terms of switching speed, and do not demand the addition of a complex and bulky reconstruction filter, nor do they demand the implementation of a complex system for temporal alignment of the bias voltage with the signal to be transmitted. However, they have the drawback of requiring more switching cells (one for each voltage level), and therefore more substrate surface. Both solutions therefore have their respective advantages and can prove more or less advantageous depending on the applications sought.

SUMMARY OF THE INVENTION

The invention is situated in the context of these multi-level switches, also known as power DAC (digital-analog converter) modulators, when they are produced in MMIC technology.

High-frequency power switching cells are known that are produced in MMIC technology from field-effect transistors, such as, for example, that described in the international patent application WO 2015/162063. Such cells are perfectly suited to the production of a multi-level converter.

However, the implementation of several of these cells in parallel necessitates the insertion of a device for insulating the cells from one another, without which the cells of lower numeric weight consume current, which induces a loss of efficiency. Furthermore, the cells that are not insulated can be subject to voltage excursions that can potentially destroy their components.

This problem is resolved in the prior art, excluding MMIC technology, by the insertion of diodes between the cells.

FIG. 2 illustrates such a setup known from the prior art, comprising switching cells insulated by diodes.

In FIG. 2, the cells 201, 202 and 203 are switching cells mounted in parallel, each of the cells being linked to a different power supply voltage 211, 212 and 213. The cells switch to an ON or OFF position, so as to deliver an output voltage 220 whose level varies according to the requirements.

Diodes 231, 232 and 233 make it possible to insulate the cells that are off from the cells that are on.

The use of diodes to insulate the different switching cells is not optimal when the multi-level switch is produced in MMIC GaN technology. Indeed, in this planar technology, the production of diodes does not give characteristics that are viable for these applications in terms of voltage withstand strength, of parasitic access resistances and of intrinsic capacitances. For example, the transistors mounted "as diode" (that is to say source and drain linked to the same potential) do not allow the passage of high currents (because these currents then pass through the gate fingers); the planar diodes with circular Schottky contact have a greater current withstand strength but access resistances and an intrinsic capacitance that are high.

Thus, the invention sets out to address the problem of producing a multi-level power converter in MMIC technology by proposing a power switching cell with high switching speed, the cell according to the invention comprising an insulating device allowing it to be mounted in parallel with other cells of the same type without reducing the efficiency or a risk of destruction of the components.

The power switching cell according to the invention therefore comprises:

an input port capable of receiving a switching control signal, an input transistor having a gate linked to said input port, and a source linked to a reference voltage, a self-biasing circuit comprising a resistor and a self-biasing transistor, a gate of said self-biasing transistor being linked to a drain of said input transistor, the resistor being connected in parallel between a gate and a source of said self-biasing transistor, and in series between a drain of the input transistor and a source of said self-biasing transistor, a power transistor, having a gate linked to a source of the self-biasing transistor and a drain linked to a power supply voltage, and a source linked to a drain of the self-biasing transistor, and an output port.

It further comprises an isolating transistor having a gate linked to a gate of the power transistor, a source linked to a source of the power transistor and a drain linked to said output port of the cell.

Advantageously, in the switching cell according to the invention, the power transistor, the self-biasing transistor and the isolating transistor are field-effect transistors of normally-conducting type.

Also advantageously, the three transistors are high electron mobility transistors (or HEMTs), produced in a technology chosen from the following list: GaN, GaAs (gallium arsenide).

Advantageously, the power transistor and the self-biasing transistor have substantially identical electrical characteristics.

The switching cell according to the invention is dimensioned such that:

the switching to the on state of the input transistor, by the input signal, commands the switching to the off state of said self-biasing, power and isolating transistors, and the switching to the off state of the input transistor, by the input signal, commands the switching to the on state of said self-biasing, power and isolating transistors.

Advantageously, the switching cell according to the invention is produced in MMIC technology.

In one embodiment of this cell, said power transistor and said isolating transistor are implemented in a single pattern comprising a central gate access, a source distributed on either side of the central gate access, a constituent drain of the power transistor on one side of the central gate access, and a constituent drain of the isolating transistor on another side of the central gate access.

Advantageously, said source and said drains are interdigital.

The invention also addresses a multi-level voltage converter, characterized in that it comprises a plurality of switching cells as described previously, arranged in parallel, each of said cells having an output port linked to one and the same output port of said multi-level converter, and being configured to supply an output voltage different from that of the other switching cells.

Finally, the invention addresses a system for amplifying a signal comprising a power amplifier and a multi-level voltage converter as described above, said multi-level voltage converter being configured to generate a dynamic bias voltage for the power amplifier.

BRIEF DESCRIPTION OF THE DRAWINGS

The invention will be better understood and other features and advantages will emerge more clearly on reading the following description, given in a nonlimiting manner, and from the attached figures in which:

FIG. 4b gives the operating point of the power transistors in the setup presented in FIG. 4a;

FIG. 5b gives the operating point of the power transistors in the setup presented in FIG. 5a;

FIG. 8b gives the operating point of the power transistors and of the isolating transistors in the setup presented in FIG. 8a;

DETAILED DESCRIPTION

Figure 1A:
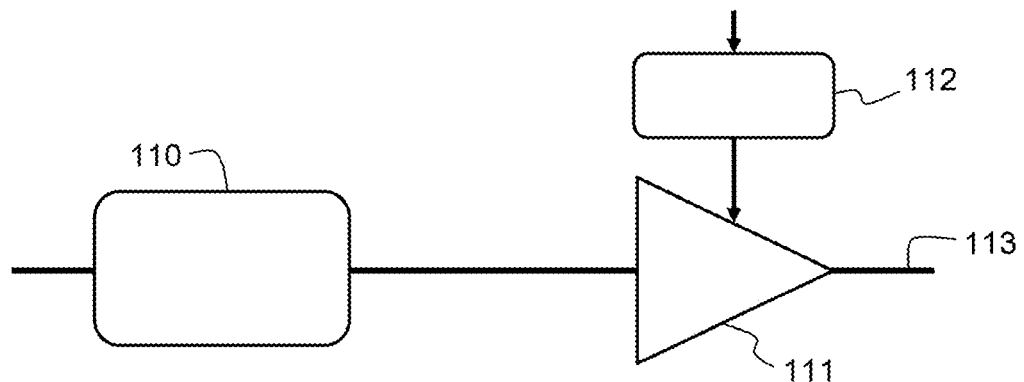
FIGS. 1a, 1b, 1c and 1d, already described, illustrate the issues linked to the dynamic management of bias voltage of power amplifiers.
Figure 1B:
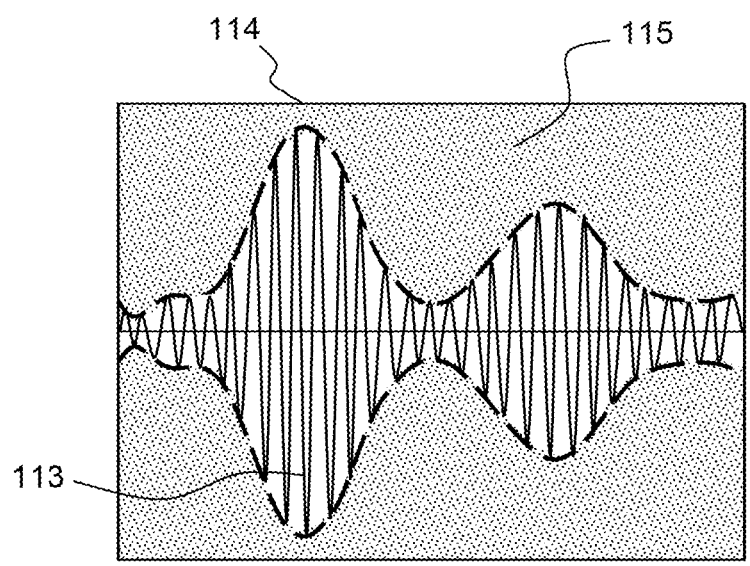
Figure 1C:
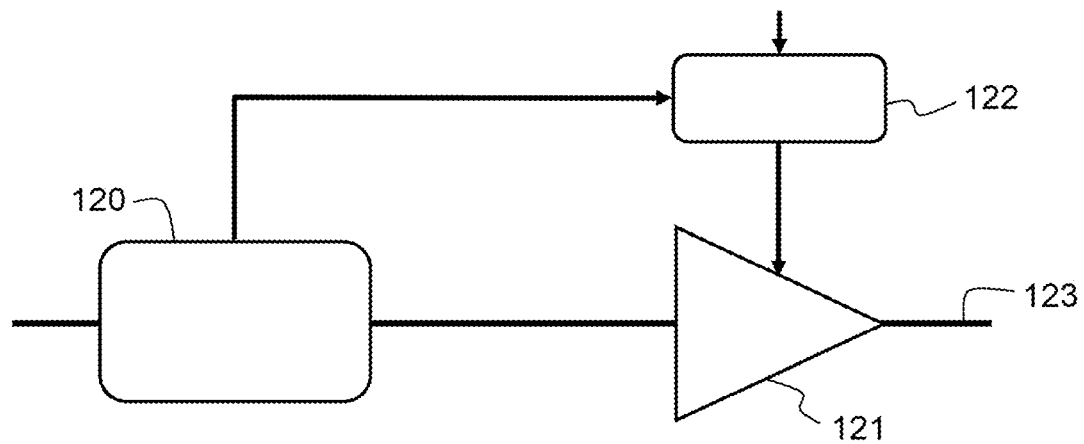
Figure 1D:
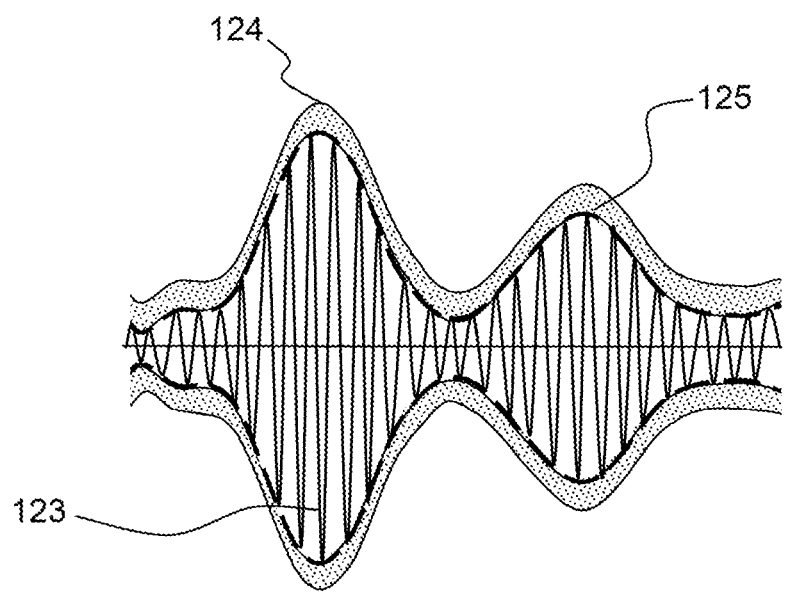
Figure 2:
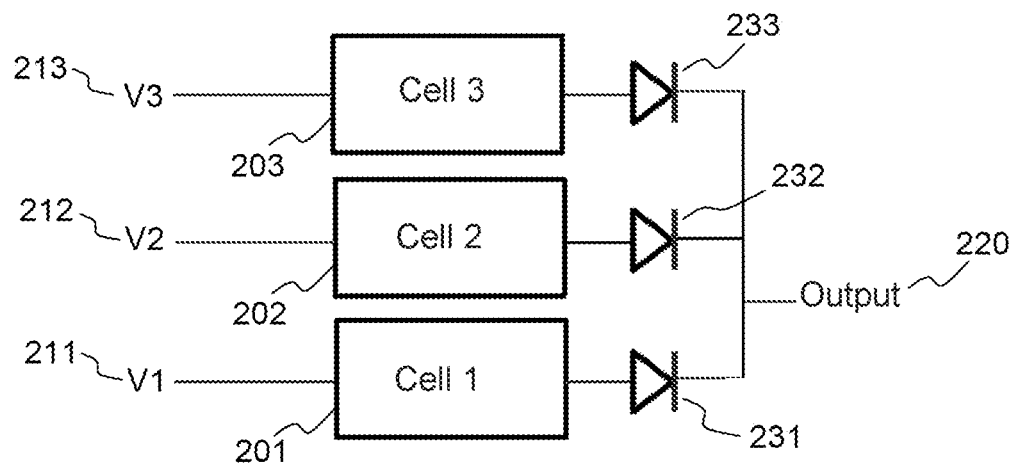
FIG. 2, already described, illustrates a multi-level switch setup according to the state of the art, produced in a technology other than an integrated technology, and in particular other than the MMIC technology.

The invention is described in the form of a switching cell for a multi-level converter used for the dynamic management of the biasing of power amplifiers. However, this description is not limiting, the switching cell according to the invention being able to be used in devices of types other than multi-level converters, and for purposes other than the management of the bias voltage of power amplifiers, such as, for example, arbitrary power signal generators for instrumentation.

Likewise, the power switching cell according to the invention is produced from transistors with depletion (also known as "depletion" transistors or normally-ON transistors), which is often the case with RF transistors (GaN, AsGa, etc.). However, with regard to the control transistor $T_{com}$, the invention can be applied identically regardless of the type of transistors used (by using for example normally-off transistors). The person skilled in the art is able to modify the relevant values of the switching cell, such as, for example, the values of the transistor control voltages, to adapt them to the types and models of transistors used, the voltage and current values described hereinafter being mentioned only by way of illustration.

Finally, the invention applies preferably to a power switching cell produced in MMIC technology, but the switching cell and the multi-level converter according to the invention can be produced in an equivalent manner in any type of technology, for example on printed circuit board PCB with surface-mounted discrete components.

The use of so-called "RF" transistors, that is to say transistors generally provided for applications at RF or microwave frequencies, makes it possible to produce switching cells that meet the needs of switching speed and of low electrical consumption in following the envelope of a signal with non-constant amplitude. The high electron mobility transistors, in particular the HEMT transistors in GaN technology, are suited to this type of production inasmuch as they are capable of conducting significant currents at high voltages (thus conferring upon them good aptitudes for use in power circuits) while having low intrinsic capacitances compared to the other technologies.

One of the main difficulties in producing rapid switching circuits lies in the production of the control of the power transistors whose source potential is floating, that is to say not referenced to a fixed potential (generally the ground): it varies between a potential close to zero and a potential corresponding to the level of the high voltage to be switched. The techniques for insulating the gate control using optocouplers or isolating transformers does not seem suitable for these high-frequency switching applications because of their relative slowness.

Moreover, a notable particular feature of many field-effect RF transistors, and in particular most of the GaN HEMTs, is that they have a so-called "depletion" mode of operation, that is to say that their channel is open when the voltage applied between their gate and their source is zero. In these conditions, if the voltage between drain and source is not zero, a non-zero current can circulate between drain and source. In order to manage to switch off such a transistor, its channel must be depleted of free charges, which is obtained by applying a negative gate-source voltage (pinch-off voltage of the transistor). In the English technical literature, "normally-ON" transistors are referred to. The use of "normally-ON" transistors, while it does not pose any particular difficulty, is not commonplace for switching applications and requires the known architectures to be adapted to this specificity.

The gate bias control of a power transistor must thus be designed to both:
  adapt to the "normally-ON" specificity of many field-effect RF transistors, allow a rapid switching, without risking a breakdown of the transistor, that is to say with a gate voltage which evolves in a well controlled manner relative to the floating source voltage,
  guarantee the safety of the device by ensuring the setting to the "OFF" state when the latter is powered up.

Moreover, the electrical losses of the switch must be as low as possible:
  by switching (passage from the "ON" state to the "OFF" state, and from the "OFF" state to the "ON" state) in the most rapid possible manner, to limit the switching losses, which is made possible by the choice of the component technology and by the production of a suitable gate control circuit, and
  by limiting the conduction losses: by choosing transistors having resistances in the on state that are the lowest possible, and by limiting their output current leaks in the off state, when their output voltage is maximum, close to the power supply voltage.

Hereinafter in the document, and unless mentioned otherwise, the transistors used are field-effect transistors, of "normally-ON" type. These transistors are composed of a metal gate, of a drain and of a source. In the "ON" state, that is to say their gate-source voltage is close to 0 V, these transistors conduct while they are blocked (open circuit) in the "OFF" state, that is to say when their gate-source voltage is negative.

Figure 3:
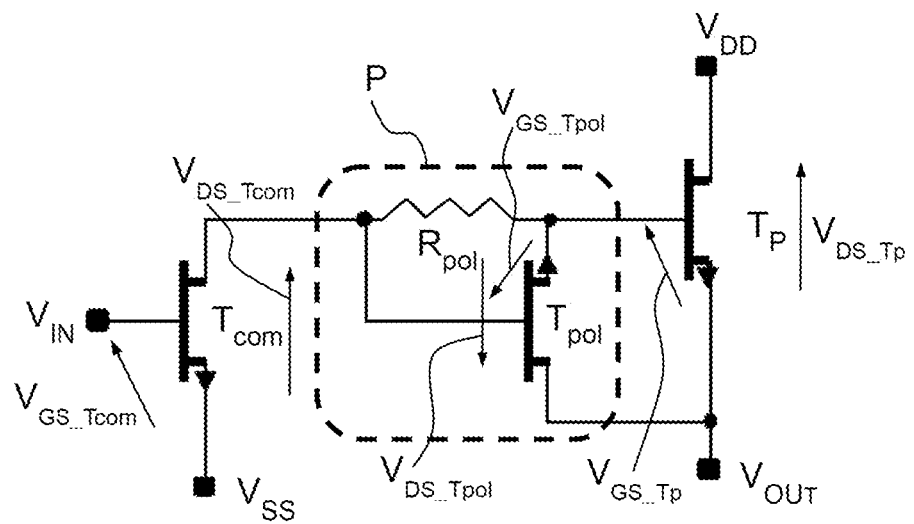
FIG. 3 represents a switching cell in MMIC technology, as described in the international patent application WO 2015/162063.

FIG. 3 represents a power switching cell that can be produced in MMIC technology, as described in the international patent application WO 2015/162063.

This cell comprises:
  a control, configured to deliver a voltage $V_{IN}$;
  a transistor $T_{com}$, called input or control transistor, whose source is linked to a voltage $V_{SS}$ source;
  a transistor $T_p$, called power transistor, whose drain is linked to a high-voltage $V_{DD}$ source;
  a biasing circuit P, comprising a transistor $T_{pol}$, called bias transistor and
  a resistor $R_{pol}$, called bias resistor;
the switching cell delivering an output voltage $V_{OUT}$.

The role of the input transistor is to switch a low current, linked to the voltage $V_{SS}$ source, to the load formed by the self-biasing circuit P and the power transistor $T_p$. The current switched by $T_{com}$ is low, compared to the current switched by the power transistor and the bias transistor. Thus, the input transistor $T_{com}$ can be chosen to be of the same type as the transistors $T_p$ and $T_{pol}$, that is to say field-effect transistors of "normally-ON" HEMT type, or of different type, such as, for example, a "normally-OFF" MOS (acronym for metal oxide semiconductor) transistor. The transistor $T_p$ switches higher currents. Its gate development is chosen so that it operates in its ohmic zone (that is to say that $V_{DS\_Tp(ON)}$ remains low) when such currents are passing.

When the transistor $T_{com}$ is in the ON state (for example when $V_{IN}=V_{SS}$), the transistors $T_p$ and $T_{pol}$ self bias. Indeed, the current I switched by the control transistor $T_{com}$ controls the operating point of the transistor $T_{pol}$ of the self-biasing circuit: this current sets the gate-source voltage $V_{GS\_Tpol}$, with $V_{GS\_Tpol}=I \cdot R_{pol}$, and the drain-source current $I_{DS\_Tpol}$, with $I_{DS\_Tpol}=I$, the current of the transistor $T_{pol}$. This operating point has a corresponding determined value of drain-source voltage $V_{DS\_Tpol}$ of the bias resistor $T_{pol}$.

By construction, the drain-source voltage $V_{DS\_Tpol}$ of the bias transistor $T_{pol}$ is equal to the inverse of the gate-source voltage $V_{GS\_Tp}$ of the power transistor $T_p$. Thus, the control transistor $T_{com}$ switched to the ON state makes it possible to apply current control to the gate-source voltage of the power switching transistor $T_p$ in the OFF state ($V_{GS\_Tp}$(OFF)).

This is an indirect control, since the current I, switched by the switching transistor $T_{com}$ is in fact supplied by the structure of the cell. The values of the current I and of the voltage $V_{GS\_Tp(OFF)}$ cannot thus be directly set. They are set indirectly, by an appropriate dimensioning of the structure of the cell, and in particular by an appropriate choice of the values of the resistor $R_{pol}$ and of the voltage $V_{SS}$, with:

$$V_{GS\_Tp(OFF)} = \left[ \frac{R_L \cdot G_{m\_Tp} - 1 - V_{SS}}{R_L \cdot G_{m\_Tp} + 1} - \frac{G_{m\_Tpol} \cdot (R_{pol} + R_L)}{(R_L \cdot G_{m\_Tp} + 1) \cdot (R_{pol} \cdot G_{m\_Tpol} + 1)} \right] \cdot V_P$$

with:
$R_L$, the load resistance at the cell output,
$G_{m\_Ti}$, the transconductance of the transistor $T_i$,
$V_p$, the pinch-off voltage of the transistors $T_p$ and $T_{pol}$, in the case where the latter have the same pinch-off voltage, which is usually the case if they are in the same MMIC technology.

When the transistor $T_{com}$ is in the ON state, the transistors $T_p$ and $T_{pol}$ are therefore in the OFF state, and the switching cell is in the OFF state. When the cell is powered up, the control of the transistor $T_{com}$ is equal to 0 V thus guaranteeing that the cell is in the OFF state and insulated from the load whatever the drain power supply voltage.

When the transistor $T_{com}$ is in the OFF state (for example when $V_{IN}=V_p+V_{SS}$), that is to say that it no longer conducts current to the load formed by the self-biasing circuit P and the power transistor $T_p$, the transistor $T_{pol}$ is switched to the conducting ON state. In this state, it is equivalent, at its output, to a resistor $R_{DS\_Tpol(ON)}$, connected between the gate and the source of the power transistor $T_p$, of very low value. The transistor $T_p$ is, too, in the conducting ON state, the switching cell then delivering an output voltage $V_{OUT}=V_{DD}$.

The speed of switching from the OFF state to the ON state of the transistor $T_p$ corresponds to the switching speed of the cell. This speed is linked to the impedance presented at the input of $T_p$, a low impedance favoring a rapid switching. In other words, during the switching phase, the transistor $T_{pol}$ must be equivalent at its output to a resistance of low value. That is the case when the transistor $T_{pol}$ is in the conducting state. During the transitional switching phase, $T_{pol}$ also switches from the quasi-blocked state to the conducting state. It then presents to $T_p$ a resistance which varies from a significant value to a low value. In practice, $T_{pol}$ has a development very much lower than $T_p$ because it does not have to conduct strong current. Its input capacitance is therefore much lower than the input capacitance of $T_p$. It can thus switch very rapidly. Its equivalent output resistance therefore very rapidly becomes equivalent to its resistance in the conducting state, low, which also allows $T_p$ to switch very rapidly.

This cell therefore allows for a rapid switching of a strong current from a control signal of a low power. It is also easy to parameterize and exhibits little in the way of losses when the cell is in the OFF state, as well as of switching losses. Such a cell, produced from GaN HEMTs, makes it possible to achieve efficiencies and switching speeds that are impossible to achieve with more conventional DC-DC converter architectures, and open the way to the production of bias modulators for "envelope tracking" applications. Their specificity rests on the existence of the self-biasing circuit of the power transistor which, stated more simply, itself generates the current the power transistor needs to switch, upon a change of state of the control transistor.

Examples of production of a multi-level switch are given hereinafter in the document, from AlInN/GaN (indium and aluminum nitride) HEMT components developed in a laboratory, of 0.25 µm gate length and of 1.5 mm total gate development (in the form of 10 150 µm long fingers).

These examples present the case of a 4-level power digital-analog converter, for which the four possible output voltages are 40 V (bit 11), 30 V (bit 10), 20 V (bit 01), and 10 V (bit 00).

The highest possible voltage, i.e. the bit '11', is sought to be obtained at the output. The cells C0, C1 and C2 are therefore controlled to the "OFF" state, and the cell in the state C3 to the "ON" state.

These examples are given by way of nonlimiting illustration, the person skilled in the art being able to adapt them by adding or eliminating cells, by modifying the components, the voltages delivered, or the state of the cells.

Figure 4A:
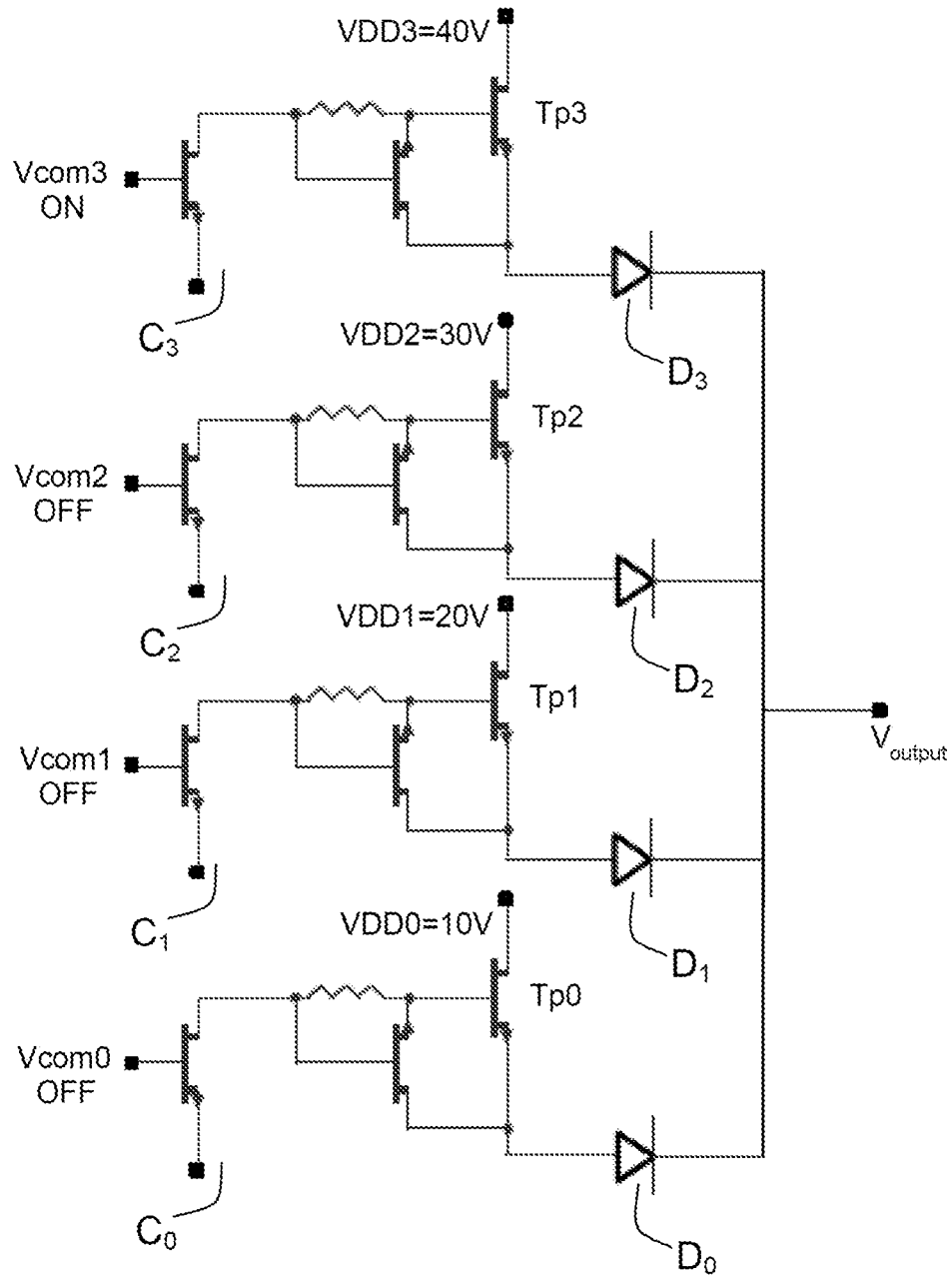
FIG. 4a represents a possible multi-level (4 levels) switch architecture comprising switching cells according to the state of the art, insulated by diodes.

FIG. 4a represents a possible multi-level switch architecture comprising switching cells according to the state of the art, the cells being insulated by diodes. The switch is a hybrid setup, the cells being able to be produced in MMIC technology, unlike the diodes, for the reasons previously described.

The switch therefore has four cells, C0, C1, C2 and C3, each of the cells being linked to a different power supply $V_{DDi}$. The cells conform to that described in FIG. 3. They each comprise a power transistor, these transistors being respectively named $T_{p0}$, $T_{p1}$, $T_{p2}$ and $T_{p3}$, and are insulated from one another by diodes named $D_0$, $D_1$, $D_2$ and $D_3$.

The input control is such that:
the power transistor $T_{p3}$ is in the "ON" state, which induces the output voltage $V_{output}$ to have the value $V_{output}=V_{DD3}=40$ V;
the other power transistors are in the "OFF" state.

Figure 4B:
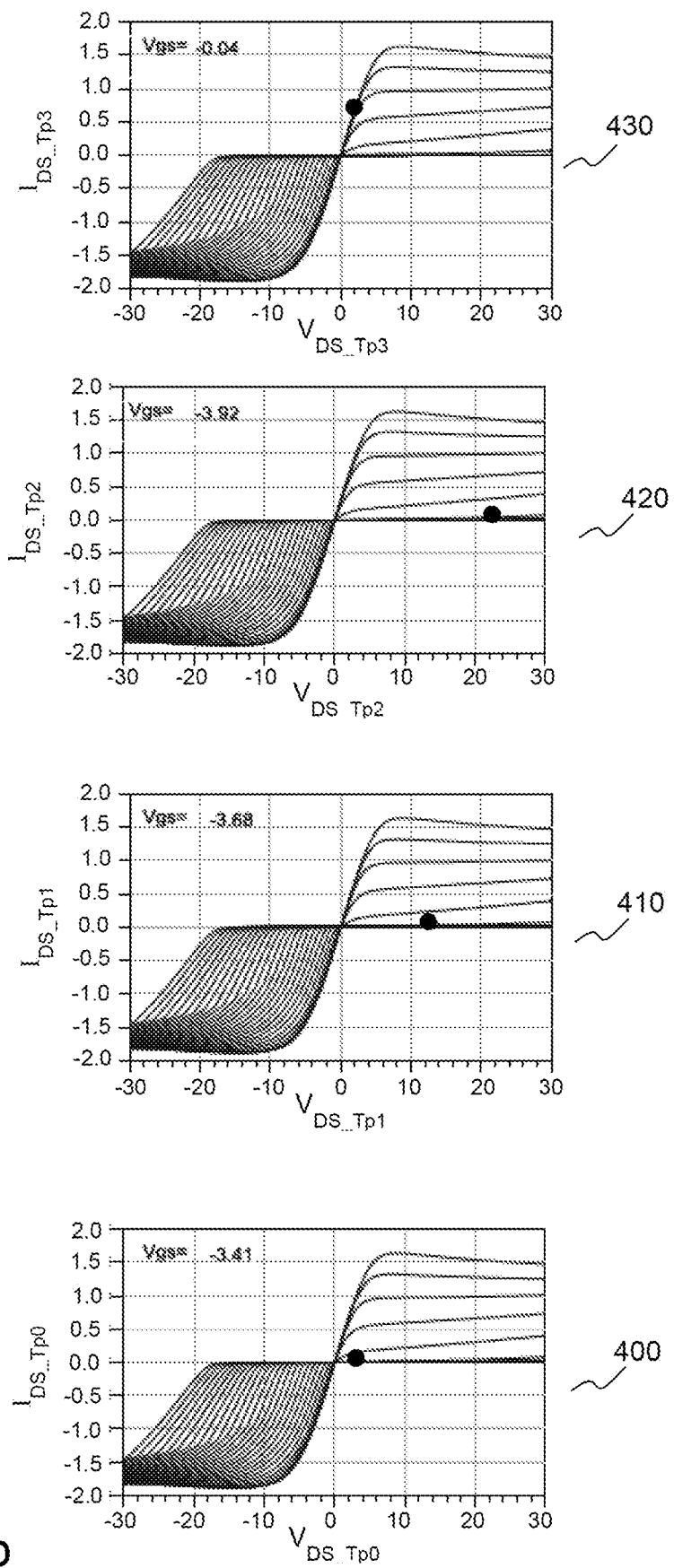

FIG. 4b gives the operating point of the power transistors in the setup presented in FIG. 4a.

The graphs 400, 410, 420 and 430 respectively give the curves of possible excursions IDS(VDS) of each of the power transistors Tp0, Tp1, Tp2 and Tp3, on which the operating points of the transistor appear.

It can be seen, in FIG. 430 in relation to the operation of the power transistor Tp3, that the gate-source voltage VGS3 is approximately 0 V, which corresponds to an ON state of the transistor ("normally-ON" transistor).

The operating point, for the associated excursion curve, is witness to a voltage VDS3 in the transistor Tp3 close to zero. Consequently, the output voltage Voutput=VDD3=40 V.

Regarding the cell C2, FIG. 420, in relation to the operation of the power transistor Tp2, indicates that the gate-source voltage VGS_Tp2 is approximately −4 V, which corresponds to an "OFF" state of the transistor.

The operating point, for the associated excursion curve, is witness to a voltage VDS_Tp2 in the transistor Tp2 of 22 V. This value corresponds to VDD2+2*Vp, Vp being approximately −4 V. Thus, the output current of this cell is zero.

The same applies for the voltage at the output of the cells C1 and C0.

For the switching cells in "OFF" state, the gate-source voltages VGS are of the order of −3.5 V to −4 V, and the voltages VDS at the terminals of the power transistors are equal to their respective VDD plus two times the pinch-off voltage of the transistors. The switch therefore operates nominally.

Figure 5A:
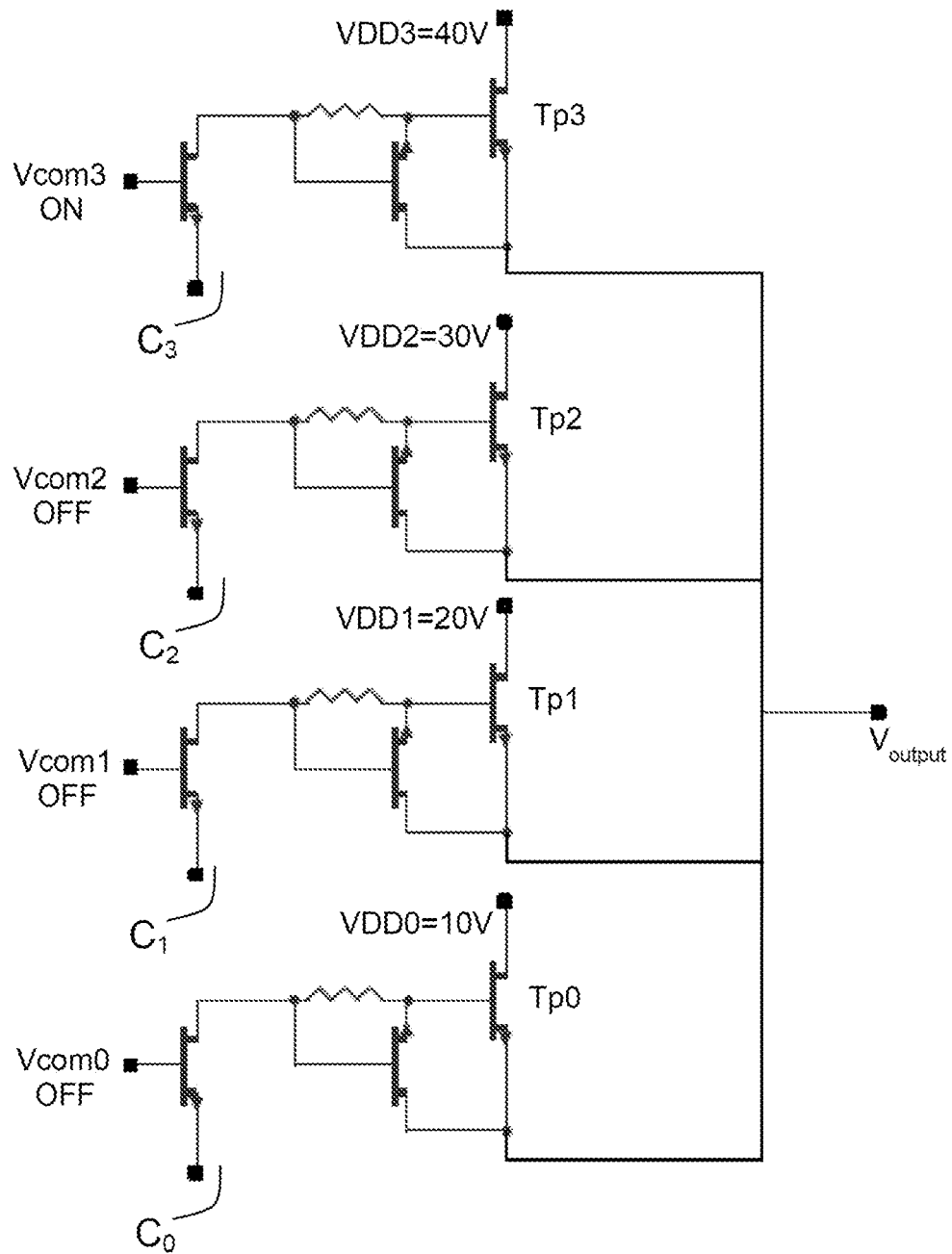
FIG. 5a represents a possible multi-level (4 levels) switch architecture comprising switching cells according to the state of the art, when they are not insulated from one another.

FIG. 5a represents a possible multi-level switch architecture comprising switching cells according to the state of the art, when they are not insulated from one another (4 voltage levels).

This figure differs from that presented in FIG. 4a only by the fact that the diodes D0 to D3 have been eliminated. The circuit can therefore be produced fully in MMIC technology.

Figure 5B:
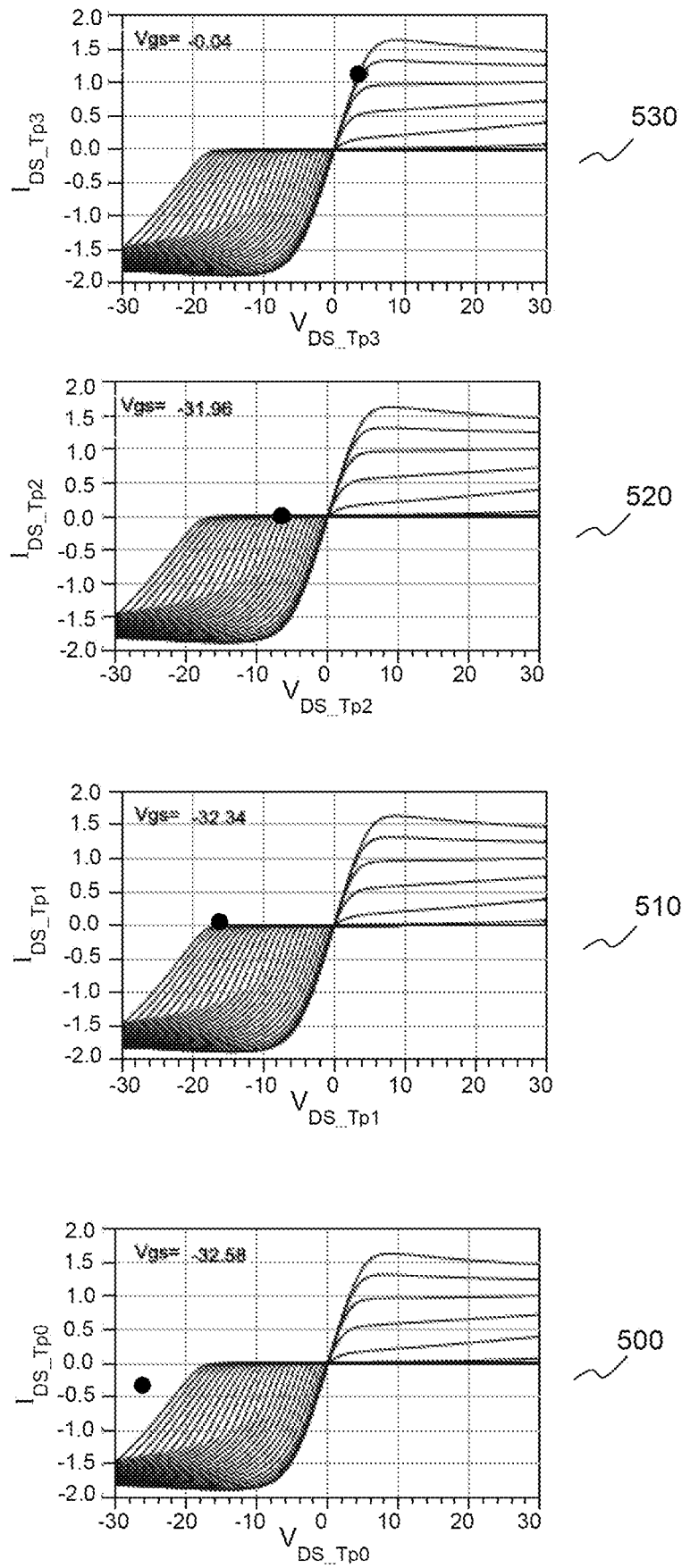

FIG. 5b gives the operating point of the power transistors in the setup presented in FIG. 5a.

The graphs 500, 510, 520 and 530 respectively give the curves of possible excursions I(V) of each of the power transistors Tp0, Tp1, Tp2 and Tp3, on which the operating points of the transistor appear.

As in the setup in which the cells are insulated by diodes, it can be seen that, in the switching cell C3, the gate-source voltage VGS3 of the transistor is approximately 0 V, which corresponds to an "ON" state of the transistor.

The operating point, for the associated excursion curve, is witness to a voltage VDS3 in the transistor Tp3 close to zero. Consequently, the output voltage Voutput=VDD3−VDS_Tp3≈40 V.

Regarding the switching cell C2, this cell is no longer insulated, and therefore has a potential at the terminals of the transistor Tp2 of VGS_Tp2=−32 V. This voltage is destructive for most of the transistor technologies and constitutes a limitation on the range of use of this cell, because this voltage is linked to the value of VDD3.

The transistor Tp2 has a negative voltage VDS2. However, it does not conduct current because its voltage VGS is much more negative than its voltage VDS. The cell is therefore indeed in the "OFF" state.

The behavior of the cell C1 is at all points identical to that of the cell C2.

Regarding the switching cell C0, the potential at the terminals of the transistor Tp0 is also VGS_Tp0=−32 V. Just as for the cells C2 and C1, such a voltage is likely to destroy the transistor.

It will also be noted that the operating point, for the associated excursion curve, is witness to a voltage VDS_Tp0 which is negative. Given the value of its voltages VDS and VGS, the power transistor is in a negative conduction mode and delivers a negative current IDS (IDS_Tp0≈−0.35 A). It then dissipates power, which contributes to reducing the electrical efficiency of the cell.

Thus, the setup represented in FIG. 5a clearly illustrates the need for an insulation of the switching cells from one another, the absence of insulation potentially resulting in a reduction of the efficiency, and a destruction of the power transistors.

Figure 6:
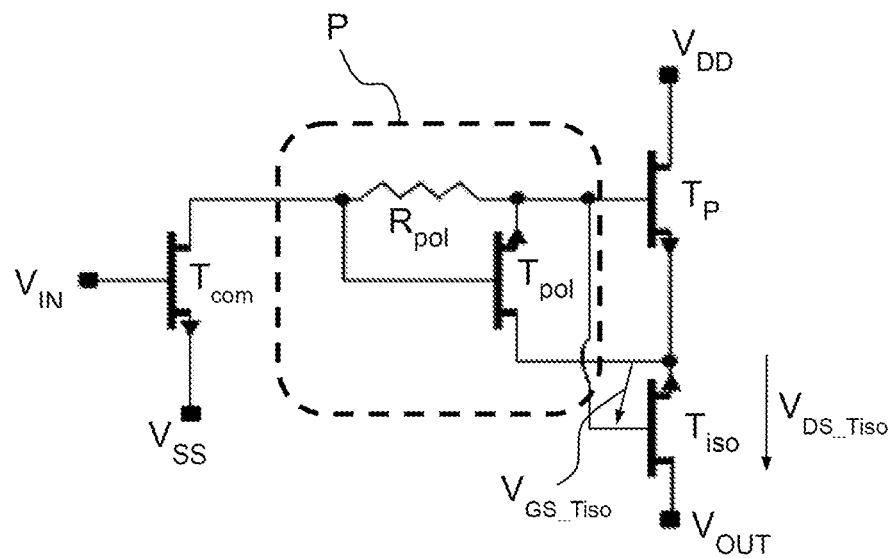
FIG. 6 represents a switching cell in MMIC technology according to the invention.

FIG. 6 represents a switching cell in MMIC technology according to the invention.

This switching cell is distinguished from that represented in FIG. 3 in that it comprises an additional transistor, called isolating transistor, or Tiso, acting as a diode, and being able to be implemented in MMIC technology.

The isolating transistor of the switching cell according to the invention is linked by its gate to the gate of the power transistor Tp. Thus, the two transistors are controlled by the same power supply voltage, they are therefore systematically in the same state.

It is also mounted symmetrically to the power transistor Tp, that is to say that its source is linked to the source of the power transistor. Since the two transistors have a gate and a common source, the gate-source voltage of the power transistor VGS_Tp is equal to the gate-source voltage of the isolating transistor VGS_iso.

Since the power and isolating transistors switch loads of the same power, they are advantageously chosen from among transistors having similar electrical characteristics.

When the cell is in the "ON" state, the gate-source voltage of the isolating transistor VGS_iso is close to 0 V, the transistor Tiso is therefore conducting and its voltage VDS_iso is very low, which has the effect of impacting the output voltage $V_{OUT}$ of the cell only at the margin.

When the cell is in the "OFF" state, the gate-source voltage of the isolating transistor VGS_iso is negative. The isolating transistor then behaves as an open circuit, which has the effect of isolating the output of the switching cell.

The switching cell according to the invention retains the rapid switching properties of the switching cell represented in FIG. 3, the switching being slightly less rapid than for the latter because the self-biasing circuit has to control two transistors of identical size instead of just one.

The switching cell according to the invention also retains the property of high efficiency of the switching cell known from the state of the art, while also exhibiting cell insulation properties, through a device that can be produced in MMIC technology.

The operation of this cell can even be adjusted, through the addition of resistors on certain connections of the cell, in order to make these connections more resistive. These resistors, that are optional and independent, make it possible in practice to produce fine adjustments, in order to improve the efficiency of the cell according to the operational conditions of use. The aim is primarily, through these resistors, to improve the margin of stability of the transistors and to limit the effects of overvoltage or of bounce induced by parasitic inductances of the structure, which are detrimental to the efficiency.

Figure 7:
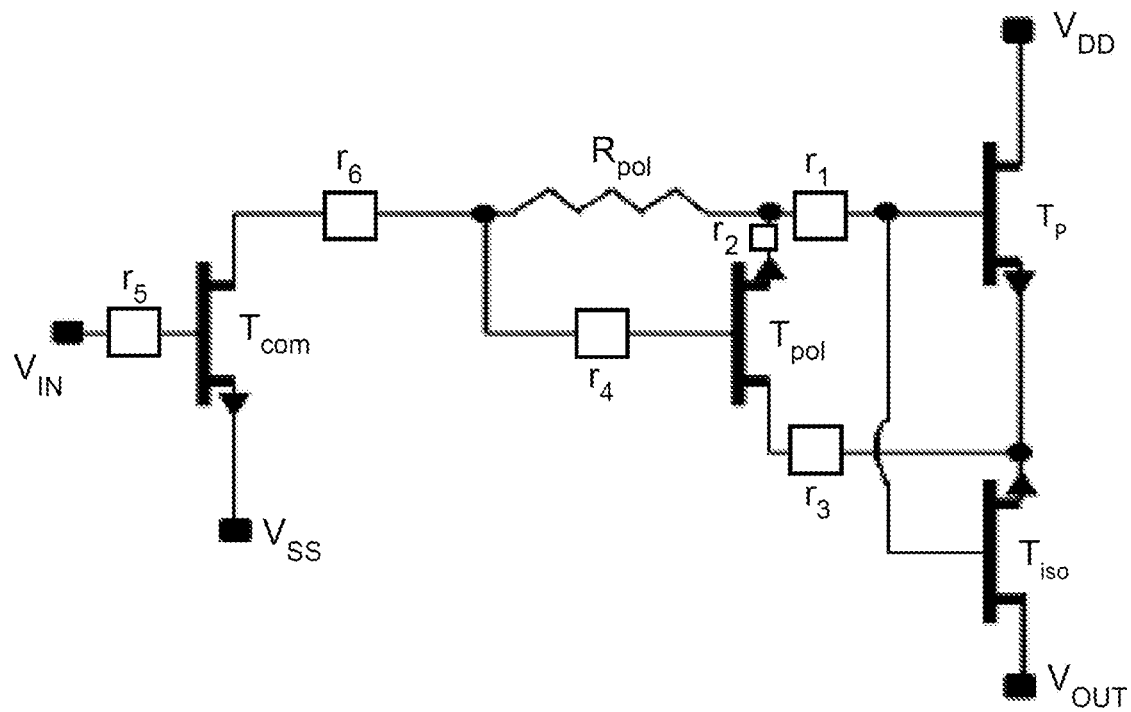
FIG. 7 shows different resistors that can be added to the switching cell according to the invention.

FIG. 7 thus shows different resistors that can be provided in the switching cell according to the invention.

In particular:
  the connection between the gate of the power transistor $T_p$ and the self-biasing resistor $R_{pol}$, and between the gate of the isolating transistor $T_{iso}$ and the self-biasing resistor $R_{pol}$ can include a resistor $r_1$;

the connection between the self-biasing resistor $R_{pol}$ and the source of the transistor $T_{pol}$ can include a resistor $r_2$;

the connection between the drain of the self-biasing transistor $T_{pol}$ and the source of the power transistor $T_p$ and of the isolating transistor $T_{iso}$ can include a resistor $r_3$;

the connection between the self-biasing resistor $R_{pol}$ and the gate of the self-biasing transistor $T_{pol}$ can include a resistor $r_4$;

the connection between the input port and the gate of the input transistor $T_{com}$ can include a resistor $r_5$;

the connection between the drain of the input transistor $T_{com}$ and the resistor $R_{pol}$ can include a resistor $r_6$.

The value of each of these resistors $r_1$ to $r_6$ is in practice determined by simulation of the operational conditions, for a given application. Depending on the case, at the end of the simulation, zero, one, several or all of these resistors will be determined with a non-zero value.

Figure 8A:
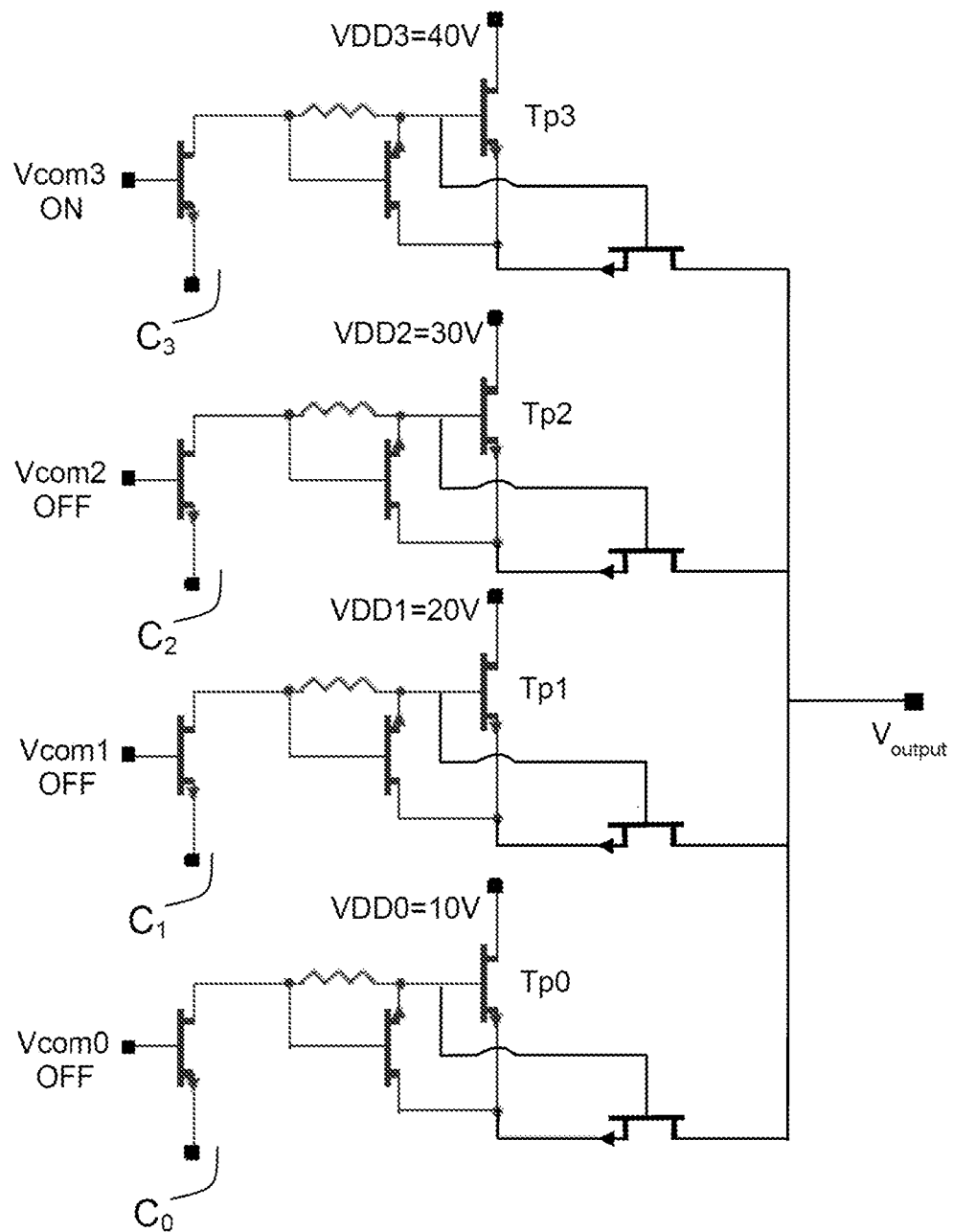
FIG. 8a represents a possible multi-level (4 levels) switch architecture comprising switching cells according to the invention.

FIG. 8a represents a possible multi-level (four levels) switch architecture comprising switching cells according to the invention.

This switch is composed of four cells: C0, C1, C2 and C3, each of the cells being linked to a different power supply $V_{DDi}$. The cells conform to that described in FIG. 6. They all comprise a power transistor named respectively $T_{p0}$, $T_{p1}$, $T_{p2}$ and $T_{p3}$, and an isolating transistor named respectively $T_{iso0}$, $T_{iso1}$, $T_{iso2}$ and $T_{iso3}$.

The power transistor Tp3 is in the "ON" state which induces the output voltage $V_{output}$ to have the value $V_{output}=V_{DD3}=40$ V.

The other power transistors are in the "OFF" state.

Figure 8B:
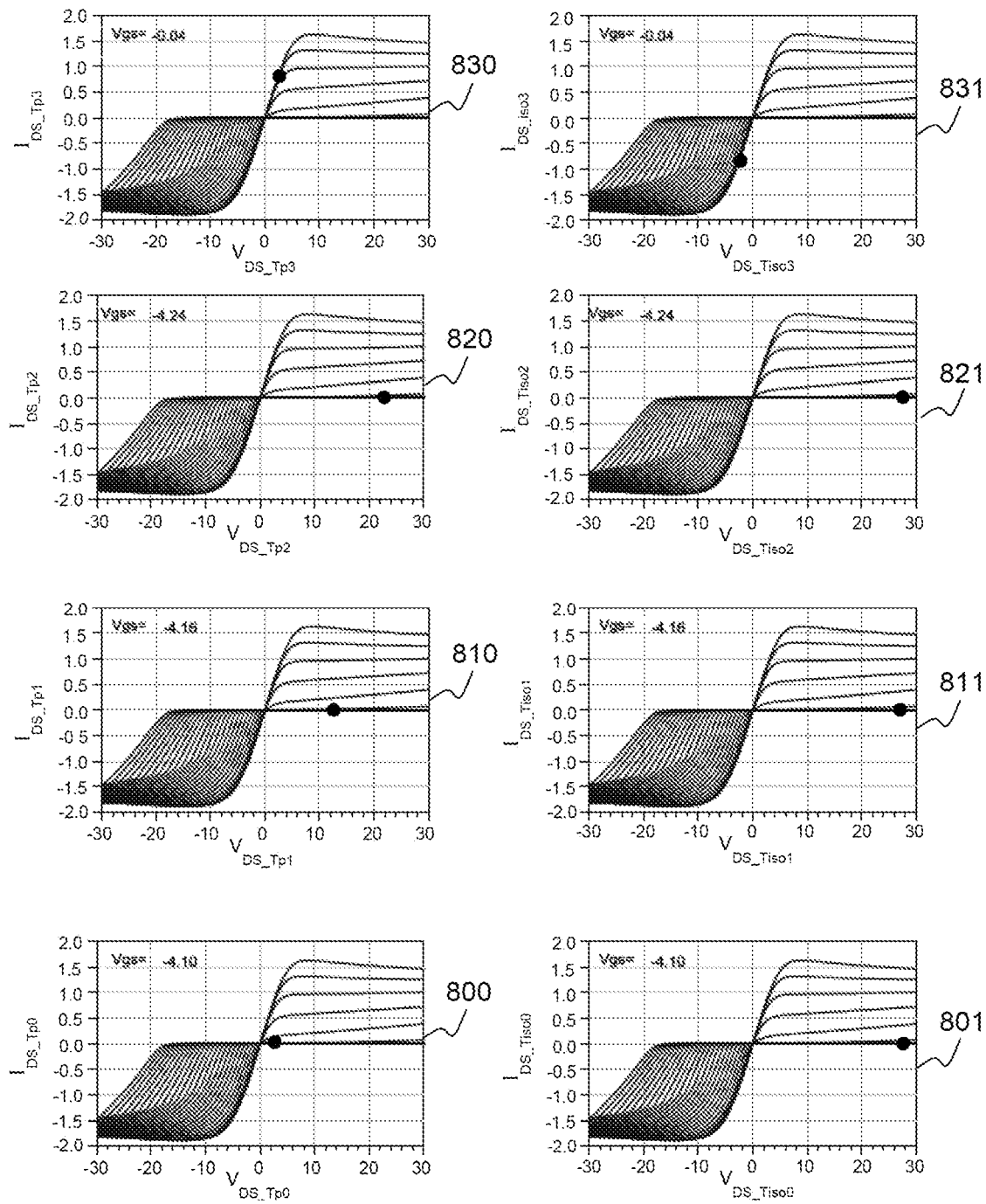

FIG. 8b gives the operating point of the power transistors in the setup presented in FIG. 8a.

The graphs 800, 810, 820 and 830 respectively give the curves of possible excursions I(V) of each of the power transistors $T_{p0}$, $T_{p1}$, $T_{p2}$ and $T_{p3}$, on which the operating points of the transistor appear.

The graphs 801, 811, 821 and 831 respectively give the curves of possible excursions I(V) of each of the isolating transistors $T_{iso0}$, $T_{iso1}$, $T_{iso2}$ and $T_{iso3}$, on which the operating points of the transistor appear.

Regarding the cell $C_3$, it can be seen, in FIG. 830 in relation to the operation of the power transistor $T_{p3}$, that the gate-source voltage $V_{GS\_Tp3}$ of the transistor is approximately equal to 0 V, which corresponds to its "ON" state.

The operating point, for the associated excursion curve, is witness to a voltage $V_{DS3\_Tp3}$ in the transistor $T_{p3}$ close to zero (in the application case, $V_{DS\_Tp3}$ is approximately equal to 3 V).

Regarding the cell $C_2$, figure 820, in relation to the operation of the power transistor $T_{p2}$, indicates that its gate-source voltage $V_{GS2}$ is approximately equal to −4 V, which corresponds to an "OFF" state of the transistor.

The operating point, for the associated excursion curve, is witness to a voltage $V_{DS2}$ in the transistor $T_{p2}$ of 22 V. This value corresponds to $V_{DD2}+2*V_p$, $V_p$ being approximately equal to −4 V. Thus, the output voltage of this cell is zero.

The same applies for the output voltage of the cells $C_1$ and $C_0$.

The cells in the "OFF" state are therefore well insulated, and the operating point of the power transistors is situated within their normal range of use, thus not risking them being destroyed. No current leakage is observed, so the efficiency of the switch is therefore optimal.

The behavior of the power transistors is therefore similar to the behavior observed when the cells are insulated by diodes, which is the aim sought by the invention.

Regarding the isolating transistors, it can be seen, in FIG. 831 in relation to the operation of the isolating transistor $T_{iso3}$, that the gate-source voltage $V_{GS\_Tiso3}$ of the isolating transistor is approximately equal to 0 V, which corresponds to its "ON" state. The isolating transistor allows the current to pass, which makes it possible to deliver a charge at the output of the circuit.

The operating point, for the associated excursion curve, is witness to a voltage $V_{DS\_Tiso3}$ in the transistor $T_{iso3}$ close to zero (in the precise application case, $V_{DS\_Tiso3} \approx -3$ V). Consequently, the output voltage $V_{output}=V_{DD3}-V_{DS\_Tp3}+V_{DS\_Tiso3} \approx 34$ V, $V_{DS\_Tp3}$ being the drain-source voltage of the power transistor $T_{p3}$ and $V_{DS\_iso3}$ being the drain-source voltage of the isolating transistor $T_{iso3}$.

For the switching cells $C_2$, in the "OFF" state, the gate-source voltage of the isolating transistor $V_{GS\_Tiso2}$ is therefore of the order of −4 V, which situates it within the nominal range of operation of the transistor, without the risk of destruction thereof. The voltage $V_{DS\_Tiso2}$ of the isolating transistor is equal to 24 V, which corresponds to $V_{OUT}-(V_{DD2}-V_{DS\_Tp2})=34$ V$-(30$V$-22$ V$)=26$ V, with $V_{DS\_Tp2}$ the drain-source voltage of the power transistor $T_{p2}$. The isolating transistor therefore performs its role perfectly, by absorbing the output voltage in order to protect the cells in the "OFF" state, while remaining at non-stressing operating points.

The analysis is the same for the switching cells $C_1$ and $C_0$:
in $C_1$, the voltage $V_{DS\_Tiso1}$ of the isolating transistor $T_{iso1}$ is equal to 26 V$=V_{OUT}-(V_{DD1}-V_{DS\_Tp1})=34$ V$-(20$ V$-12$ V);
in $C_0$, the voltage $V_{DS\_Tiso0}$ of the isolating transistor $T_{iso0}$ is equal to 26 V$=V_{OUT}-(V_{DD0}-V_{DS\_Tp0})=34$ V$-(10$ V$-2$ V), the isolating transistors here again playing their role, the voltages $V_{GS}$ of the power and isolating transistors being maintained within their nominal range of operation, and the cells in the "OFF" state not consuming current.

Figure 9:
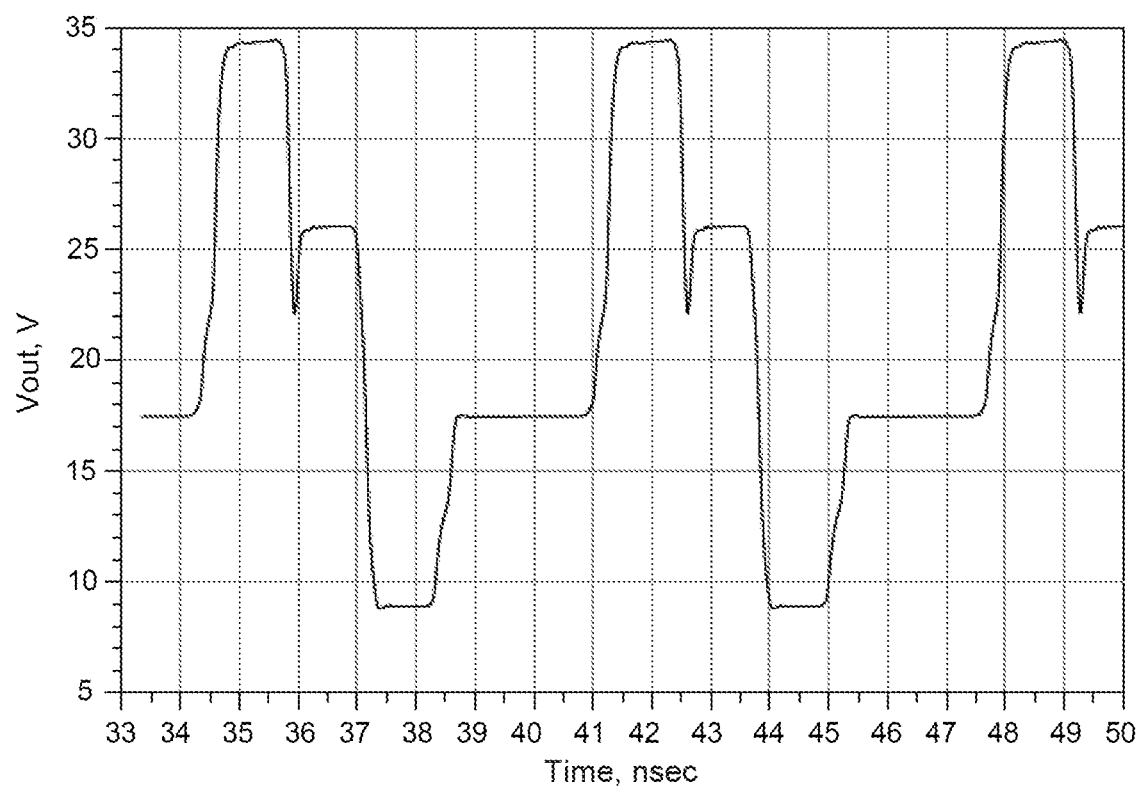
FIG. 9 gives an example of voltage switching at the output of a multi-level switch comprising switching cells according to the invention, produced in simulation.

FIG. 9 gives an example of voltage switching at the output of a multi-level switch with four levels comprising switching cells insulated according to the invention, produced in simulation from transistors described previously, and making it possible to switch voltages up to 40 V on a load of 50 ohms.

Each voltage state has a duration of 1.33 ns, i.e. a switching frequency of each cell of 750 MHz. With a sinusoidal signal requiring 6 voltage states to be reproduced, this circuit can convert signals having frequencies of 125 MHz. Rise and fall times between the different voltage levels delivered of the order of 0.4 ns are observed.

In the switching cell according to the invention, the power transistor and the isolating transistor share the same gate and the same source. The implementation of these two transistors in an integrated circuit can therefore be realized advantageously by pooling the common elements, so as to reduce the occupancy of the cell, as represented in FIGS. 10a and 10b.

These examples are given by way of illustration, and are not limiting, the person skilled in the art being able to easily find other equivalent arrangements based on his or her general knowledge.

Figure 10A:
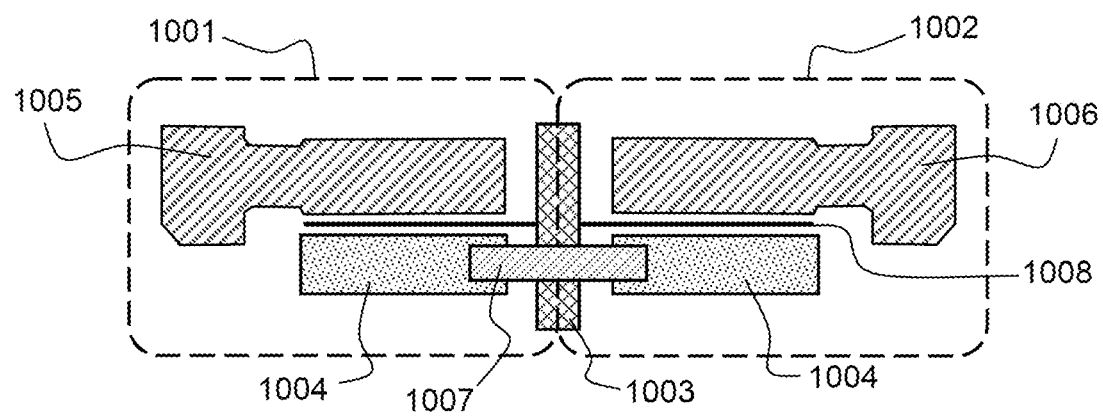
FIGS. 10a and 10b represent an example of production in MIMIC technology of the power and isolating transistors in a switching cell according to the invention.
Figure 10B:
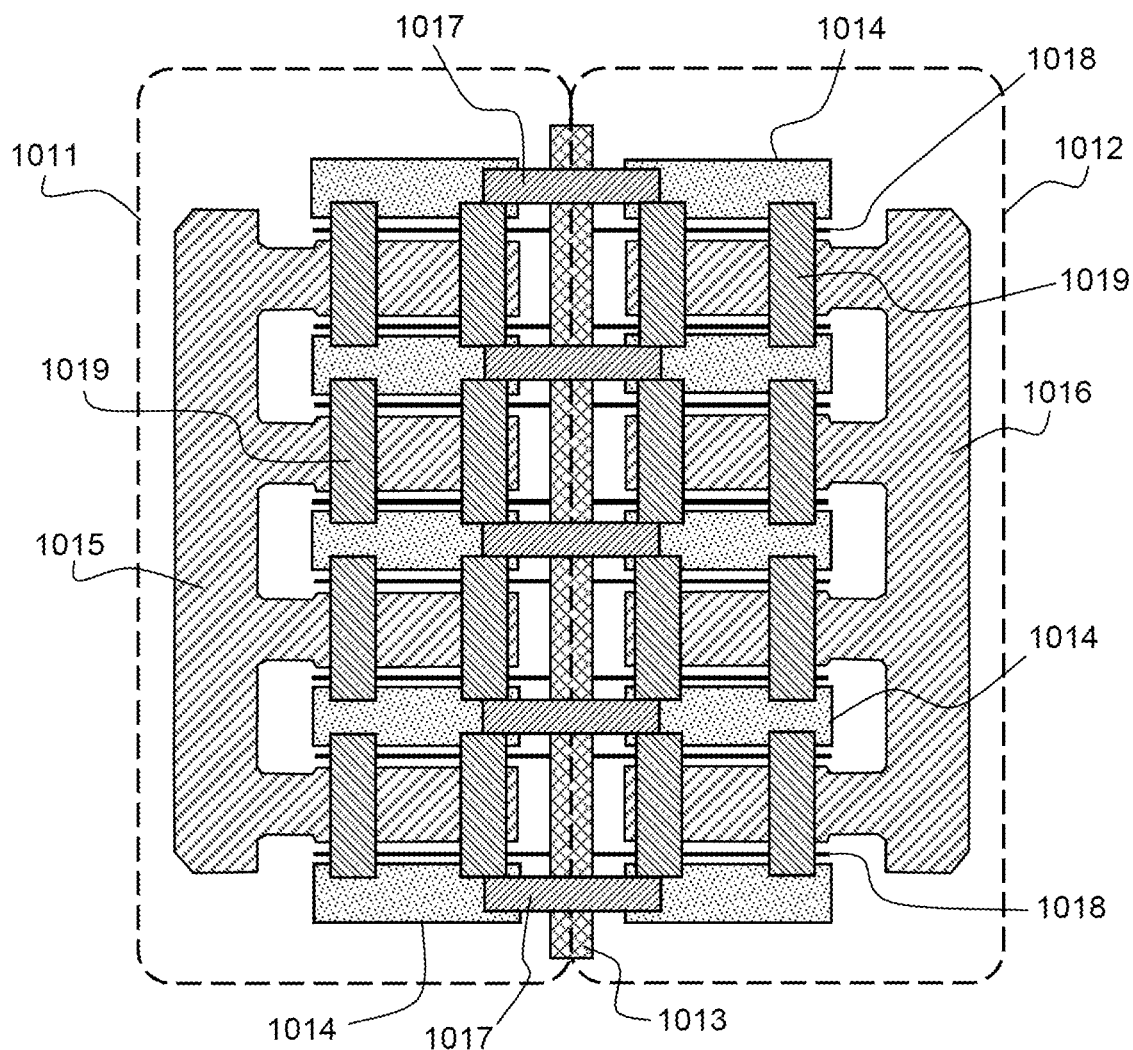

To this end, FIG. 10a represents an example of production in MMIC technology of the power and isolating transistors in a switching cell according to the invention.

The power transistor 1001 and the isolating transistor 1002 are produced in a single compact active pattern comprising a central gate access 1003, allowing the gates to be controlled by one and the same control current, and a source 1004 that is common to both transistors, distributed on either side of the central gate access, and linked between these two parts by a source bridge 1007, which passes over the central gate access.

The power transistor 1001 also comprises a drain 1005, having an access, and positioned on one side of the central gate access.

The isolating transistor 1002 comprises another drain 1006, having a different access from the drain 1005, and positioned on the other side of the central gate access.

Finally, the pattern comprises a gate finger 1008, linked to the central gate access, and which extends between the source 1004 and the drains 1005 and 1006.

FIG. 10b represents another, more advantageous, example of production in MMIC technology of the power and isolating transistors in a switching cell according to the invention.

In this example, and according to a technique known to the person skilled in the art, the drains and sources of the transistors are produced in the form of interdigital fingers, in order to increase their efficiency.

Just as in FIG. 10a, in the switching cell according to the invention, the power 1011 and isolating 1012 transistors are produced in one and the same active pattern comprising a central gate access 1013, allowing the gates to be controlled by one and the same control current, and a source 1014 that is common to the two transistors. This source is distributed on either side of the central gate access, the parts being linked by source bridges 1017, which pass over this central access. The source 1014 has fingers that are interdigital with the fingers of the drains 1015 and 1016 of the different transistors. The source fingers are linked together by source bridges 1019 which pass above the drain fingers.

The power transistor 1011 also comprises a drain 1015, having an access, and positioned on one side of the central gate access. This drain comprises fingers interleaved with the fingers of the source 1014 of the pattern.

The isolating transistor 1012 comprises another drain 1016, having a different access from the drain 1015, and positioned on the other side of the central gate access. This drain, once again, comprises fingers that are interleaved with the fingers of the source 1014 of the pattern.

Finally, the pattern comprises gate fingers 1018, linked to the central gate access, and which extend between the source fingers 1014 and the drain fingers 1015 and 1016.

The invention claimed is:

1. A power switching cell comprising:
an input port capable of receiving a switching control signal ($V_{IN}$), an input transistor ($T_{com}$) having a gate linked to said input port, and a source linked to a reference voltage ($V_{SS}$),
a self-biasing circuit (P) comprising a resistor ($R_{pol}$) and a self-biasing transistor ($T_{pol}$), a gate of said self-biasing transistor being linked to a drain of said input transistor ($T_{com}$), the resistor ($R_{pol}$) being connected in parallel between a gate and a source of said self-biasing transistor ($T_{pol}$) and in series between a drain of the input transistor and a source of said self-biasing transistor ($T_{pol}$),
a power transistor ($T_p$), having (i) a gate linked to a source of the self-biasing transistor ($T_{pol}$), (ii) a drain linked to a power supply voltage ($V_{DD}$), and (iii) a source linked to a drain of the self-biasing transistor ($T_{pol}$), and
an output port,
wherein the switching cell further comprises an isolating transistor ($T_{iso}$) having (i) a gate linked to a gate of the power transistor ($T_p$), (ii) a source linked to a source of the power transistor ($T_p$), (iii) and a drain linked to said output port of the cell.

2. The switching cell as claimed in claim 1, wherein the power transistor ($T_p$), the self-biasing transistor ($T_{pol}$) and the isolating transistor ($T_{iso}$) are field-effect transistors of normally-conducting type.

3. The switching cell as claimed in claim 2, wherein the field-effect transistors are of HEMT type produced in a technology chosen from the following list: GaN, GaAs.

4. The switching cell as claimed in claim 1, produced in MMIC technology.

5. The switching cell as claimed in claim 4, wherein said power transistor ($T_p$) and said isolating transistor ($T_{iso}$) are implemented in a single pattern comprising a central gate access, a source distributed on either side of the central gate access, a constituent drain of the power transistor on one side of the central gate access, and a constituent drain of the isolating transistor on another side of the central gate access.

6. The switching cell as claimed in claim 4, wherein said source and said drains are interdigital.

7. A multi-level voltage converter, comprising a plurality of switching cells ($C_0$, $C_1$, $C_2$, $C_3$) as claimed in claim 1 arranged in parallel, each of said cells having an output port linked to one and the same output port of said multi-level converter, and being configured to supply an output voltage different from that of the other switching cells.

8. A system for amplifying a signal comprising a power amplifier and a multi-level voltage converter as claimed in claim 7, said multi-level voltage converter being configured to generate a dynamic bias voltage for said power amplifier.

9. The switching cell as claimed in claim 1, wherein the power transistor ($T_p$) and the isolating transistor ($T_{iso}$) have substantially identical electrical characteristics.

10. The switching cell as claimed in claim 1, dimensioned such that:
the switching to the on state of the input transistor ($T_{com}$), by the input signal ($V_{IN}$), commands the switching to the off state of said self-biasing ($T_{pol}$), power ($T_p$) and isolating ($T_{iso}$) transistors, and
the switching to the off state of the input transistor ($T_{com}$), by the input signal ($V_{IN}$), commands the switching to the on state of said self-biasing ($T_{pol}$), power ($T_p$) and isolating ($T_{iso}$) transistors.

* * * * *